United States Patent
Larson et al.

(10) Patent No.: US 6,868,100 B2
(45) Date of Patent: Mar. 15, 2005

(54) METHODS FOR ROBUST CHANNEL SWITCHING OF WIDELY-TUNABLE SAMPLED-GRATING DISTRIBUTED BRAGG REFLECTOR LASERS

(75) Inventors: Michael C. Larson, Santa Barbara, CA (US); Larry A. Coldren, Santa Barbara, CA (US); Torsten Wipiejewski, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 131 days.

(21) Appl. No.: 10/310,393

(22) Filed: Dec. 4, 2002

(65) Prior Publication Data

US 2003/0147442 A1 Aug. 7, 2003

Related U.S. Application Data

(60) Provisional application No. 60/336,747, filed on Dec. 4, 2001.

(51) Int. Cl.[7] .................................................. H01S 3/10
(52) U.S. Cl. ......................... 372/20; 372/29.02; 372/32; 372/50
(58) Field of Search ............................. 372/20, 50, 32, 372/29.02

(56) References Cited

U.S. PATENT DOCUMENTS 5,838,714 A * 11/1998 Delorme ..................... 372/96

FOREIGN PATENT DOCUMENTS

| WO | WO 99/40654 | 8/1999 |
| WO | WO 00/52789 | 9/2000 |

OTHER PUBLICATIONS

Jayaraman, Vijasekhar et al., *Theory, Design, and Performance of Extended Tuning Range Semiconductor Lasers with Sampled Gratings*, IEEE J. Quantum Elec., vol. 29, No. 6, pp. 1824–1834, Jun. 1993.

Mawatari, Hiroyasu, *Lasing Wavelength Changes Due to Degradation in Buried Heterostructure Distributed Bragg Reflector Lasers*, J. of Lightwave Technology, vol. 17, No. 5, May 1999, pp. 918–923.

* cited by examiner

*Primary Examiner*—James Davie
(74) *Attorney, Agent, or Firm*—Gates & Cooper LLP

(57) ABSTRACT

The present invention describes methods and apparatus for reliably assuring that correct mirror currents are selected during a channel switch to achieve the desired wavelength channel, based on feedback from either internal or external means combined with a mode map obtained at a time zero calibration.

78 Claims, 9 Drawing Sheets

US 6,868,100 B2

METHODS FOR ROBUST CHANNEL SWITCHING OF WIDELY-TUNABLE SAMPLED-GRATING DISTRIBUTED BRAGG REFLECTOR LASERS

CROSS-REFERENCE TO RELATED APPLICATIONS

This application claims the benefit under 35 U.S.C. §119 (e) of co-pending and commonly-assigned U.S. provisional patent application Ser. No. 60/336,747, filed Dec. 4, 2001, by Michael C. Larson, Larry A. Coldren and Torsten Wipiejewski, and entitled "IMPROVED METHODS FOR ROBUST CHANNEL SWITCHING OF WIDELY-TUNABLE SAMPLED-GRATING DISTRIBUTED BRAGG REFLECTOR LASERS," which application is incorporated by reference herein.

BACKGROUND OF THE INVENTION

1. Field of the Invention

The invention relates to the field of widely-tunable lasers, and more particularly, to methods for robust channel switching of widely-tunable sampled grating distributed Bragg reflectors (SGDBR) lasers.

2. Description of the Related Art (This application references publications and a patent, as indicated in the specification by a reference number enclosed in brackets, e.g., [x]. These publications and patent, along with their associated reference numbers, are identified in the section below entitled "References.")

There are a variety of semiconductor laser designs in which the wavelength can be tuned by current injection into one or more sections of the laser that have some spectral filtering characteristics. Examples include moderately-tunable devices, such as distributed Bragg reflector (DBR) lasers, and widely-tunable devices, such as sampled grating distributed Bragg reflector (SGDBR) lasers.

In each of these devices, precise control of each of the currents provided to the various sections of the laser is required to achieve a desired output wavelength. The amount of current injected into each section to achieve a given wavelength can vary with both device temperature and aging. For example, over time, as the device ages, changes in leakage current and carrier lifetime in the tuning sections cause the laser output wavelength to drift. This variation in tuning characteristics requires the use of some sort of feedback control system in order for such tunable lasers to be used in applications where precise wavelength control must be maintained, such as dense wavelength division multiplexed (DWDM) communications systems.

Therefore, there is a need in the art for improved methods of channel switching of widely-tunable lasers. Specifically, there is a need in the art for methods that assure proper channel selection in spite of long-term aging or environmental effects.

SUMMARY OF THE INVENTION

The present invention describes methods and apparatus for reliably assuring that correct mirror currents are selected during a channel switch to achieve the desired wavelength channel, based on feedback from either internal or external means combined with a mode map obtained at a time zero calibration.

The present invention is generally directed to a method of switching an output wavelength of a multi-section laser containing two or more current-controlled, tunable, wavelength-selective elements. This method comprises selecting front and back mirror currents, by counting cavity mode boundaries or hops, to tune the laser output to a wavelength of a target channel based on a feedback signal combined with a mode map, wherein the feedback signal results from a selection of one or more sets of tuning currents intermediate between those of an initial channel and the target channel, and the mode map comprises a two-dimensional grouping of the front and back mirror currents corresponding to cavity modes of the laser as measured at an earlier time.

The method further comprises classifying and organizing the two-dimensional plot of the front and back mirror currents in order to translate the feedback signal into separate corrections for the front and back mirror currents.

The feedback signal is generated by internal or external means, and identifies mirror currents at which cavity mode boundaries or hops occur. The identified cavity mode boundaries or hops are compared to the mode map cavity mode boundaries in order to provide incremental corrections to a path from the initial channel to the target channel. The method further comprises choosing the path from the initial channel to the target channel that converts nonlinear motion to self-correcting feedback for the front and back mirrors of the laser.

In one embodiment, the present invention is a method for switching from an initial channel to a target channel for an output beam of a laser, comprising: ramping front and back mirror currents for the laser in a coordinated manner based on a traversal of a mode map along a path leading from the initial channel to the target channel, wherein the mode map comprises a two-dimensional plot of the front and back mirror currents that identifies one or more cavity modes for the laser; detecting cavity mode boundaries as the front and back mirror currents for the laser are ramped; and comparing the detected cavity mode boundaries with the cavity mode boundaries in the mode map in order to provide incremental corrections to the traversal of the mode map.

The front and back mirror currents are ramped in the coordinated manner to induce cavity mode hops with a phase current held constant. The comparing step comprises counting intermediate cavity mode boundaries, and more specifically comprises comparing positions of the detected cavity mode boundaries with the positions of the cavity mode boundaries in the mode map to generate a feedback signal that corrects for aging-induced changes in the front and back mirrors' tuning efficiencies.

The traversal of the mode map along the path leading from the initial channel to the target channel is based on intermediate motion through one or more cavity mode centers. The motion comprises one or more slides, side-slides or jumps, wherein the slide comprises continuous movement along a positive diagonal supermode trajectory in the mode map, the side-slide comprises continuous movement transverse to a supermode trajectory in the mode map, and the jump comprises discontinuous movement from a center of one cavity mode to a center of another cavity mode in the mode map.

The motion generates one or more errors in one or more dimensions as a result of device aging. The method further comprises applying one or more motion rules to the traversal of the mode map, wherein each of the motion rules is a constraint on a maximum distance that is traveled in one direction in the mode map before movement in an orthogonal direction is required.

The method may also comprise moving the front and back mirrors by fractional cavity mode spacing to obtain the target channel, using cavity mode boundary detection to allow fast re-centering within the cavity mode, and switching the front and back mirror currents discontinuously to proximate to a next expected cavity mode boundary, when a cavity mode boundary is detected.

In another embodiment, the present invention is a method for switching from an initial channel to a target channel for an output beam of a laser, comprising: (a) setting front and back mirror currents for the laser to an estimate of the front and back mirror currents for the target channel obtained from a mode map, wherein the mode map comprises a two-dimensional plot of the front and back mirror currents that identifies one or more cavity modes for the laser; (b) measuring a wavelength of the output beam to determine a wavelength error resulting from the setting step; and (c) converting the wavelength error to corrections for the front and back mirror currents.

The method may further comprise computing error vectors for the front and back mirror currents and computing the corrections for the front and back mirror currents based on the error vectors, or dithering the front and back mirror currents in accordance with cavity mode boundary detection to re-center within the cavity mode.

The corrections may be first order corrections for the front and back mirror currents, as well as second order corrections for the front and back mirror currents based on an aging model.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention relates to the control of widely-tunable Vernier-type semiconductor lasers, of which the sampled-grating distributed Bragg reflector (SGDBR) laser is a promising example. More specifically, the present invention focuses on novel methods for reliably assuring that correct mirror currents are selected during a channel switch to achieve the desired wavelength channel, based on feedback from either internal or external means combined with a mode map obtained at an earlier time point or at a time zero calibration.

These methods assure proper channel selection in spite of long-term aging or environmental effects, which typically result in incrementally more currents over time to achieve the same channel [1], and which would otherwise result in switching to the wrong wavelength channel if left uncompensated. These aging effects manifest themselves as deformations in the mode map.

The present invention includes means for classifying and organizing a two-dimensional (front and back) mirror current space in order to translate a single feedback variable into separate corrections for two mirror currents.

Figure 1:
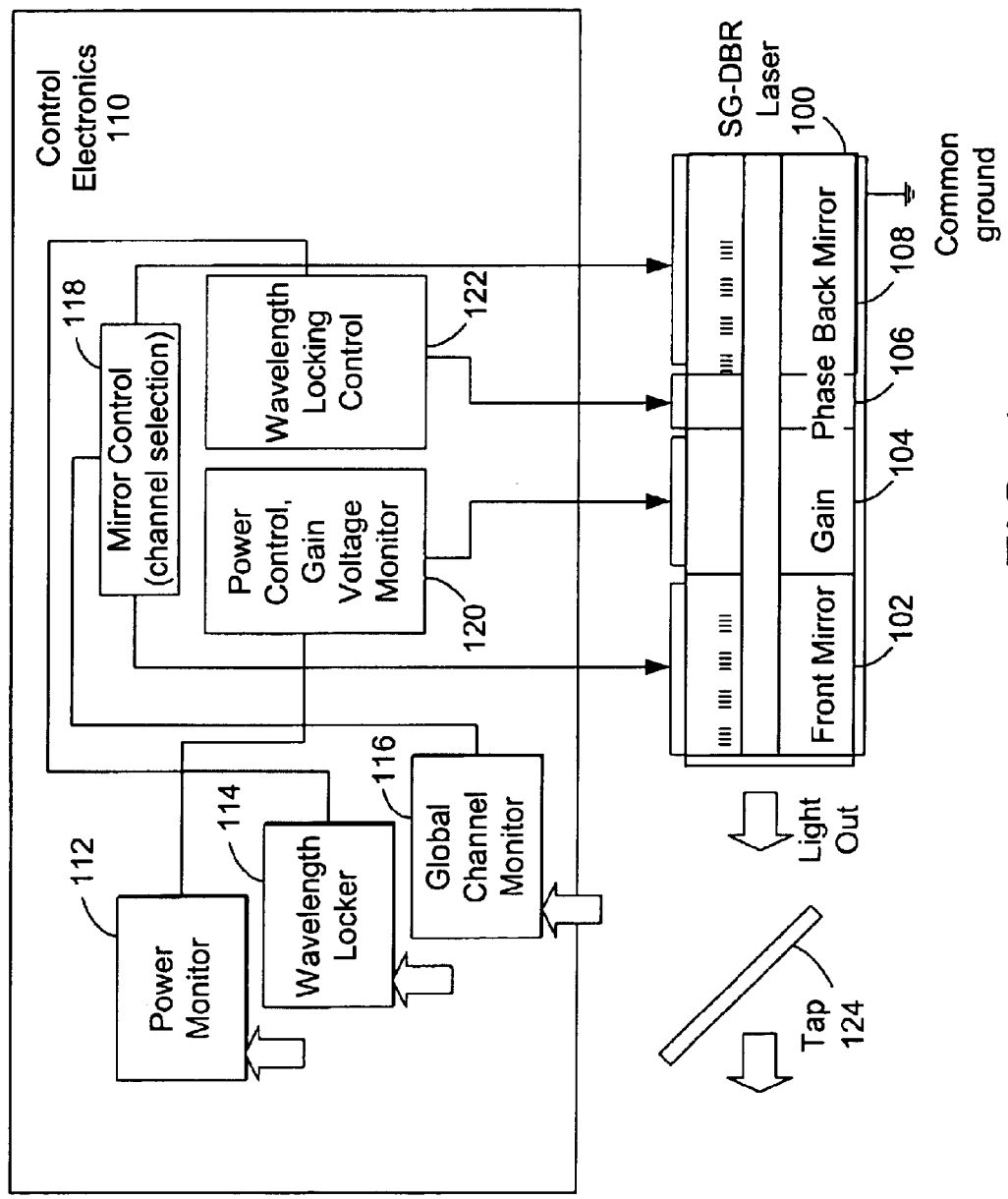
FIG. 1 is a schematic diagram of a sampled-grating distributed Bragg reflector laser, including front mirror, gain, phase, and back mirror sections.

FIG. 1 is a schematic diagram of a multi-section SGDBR laser 100 containing two or more current-controlled, tunable, wavelength-selective elements. Specifically, the SGDBR laser 100 includes front mirror 102, gain 104, phase 106, and back mirror 108 sections. [2] Also shown in FIG. 1 are control electronics 110, which would typically contain feedback components, including a power monitor 112, wavelength locker 114 and global channel monitor 116, as well as control components, including mirror control 118, power control and gain voltage monitor 120 and wavelength locking control 122.

An output beam generated by the laser 100 is tapped 124 into the power monitor 112, wavelength locker 114 and global channel monitor 116, which generate feedback signals for the mirror control 118, power control and gain voltage monitor 120 and wavelength locking control 122, respectively. The mirror control 118 uses the feedback signal from the global channel monitor 116 to control the amount of current into the front and back mirrors 102, 108; the power control and gain voltage monitor 120 uses the feedback signal from the power monitor 112 to control the amount of current into the gain section 104; and the wavelength locking control 122 uses the feedback signal from the wavelength locker 114 to control the amount of current into the phase section 106.

Figure 2:
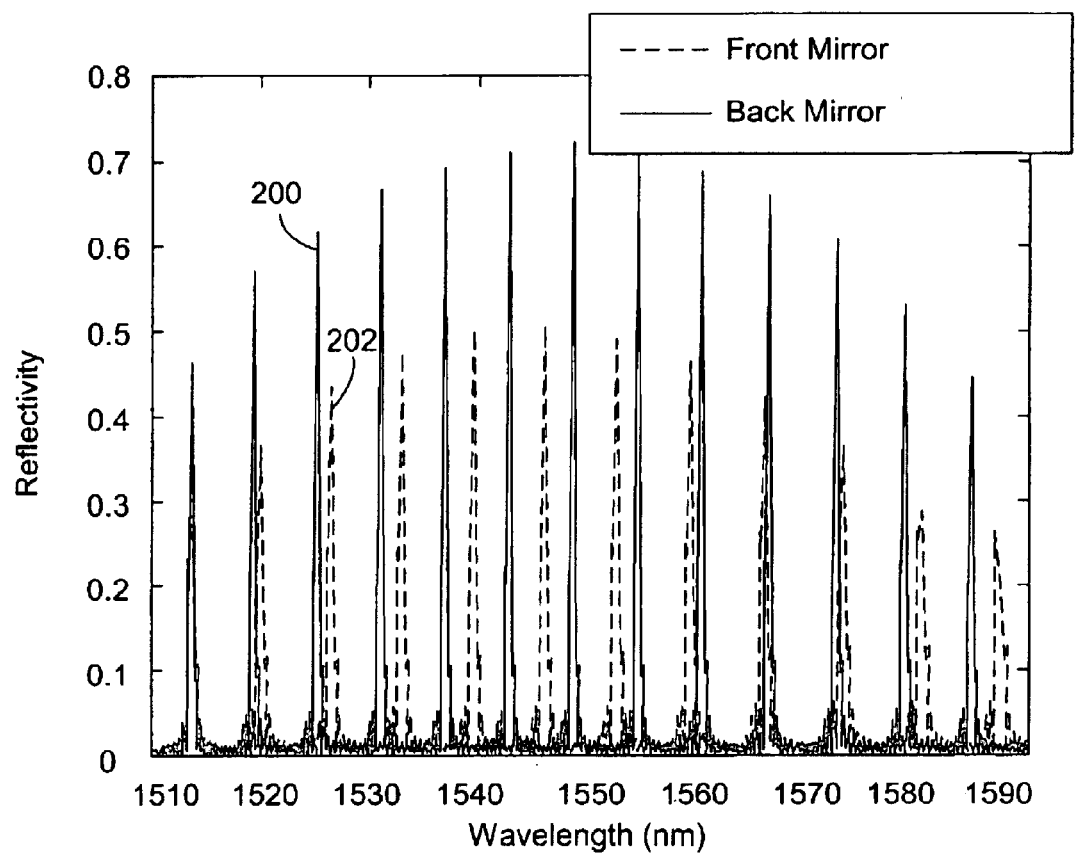
FIG. 2 is a graph that illustrates the reflectivity spectrum of the sampled grating mirrors showing the multiple mirror peaks used to cover the tuning range.

FIG. 2 is a graph that illustrates the reflectivity spectrum of the sampled grating mirrors 102, 108, showing the multiple mirror 102, 108 peaks used to cover the tuning range. Note that the higher peaks 200 illustrate the reflectivity of the back mirror 108, while the corresponding lower peaks 202 illustrate the reflectivity of the front mirror 102. Each of the mirrors 102, 108 contains a grating that has been sampled, i.e., periodically blanked, which results in a reflectance spectrum that contains periodically-spaced peaks that are typically separated by ~5 nm near 1550 nm.

Currents shift the reflectance spectrum of either the front mirror 102 or back mirror 108 to shorter wavelengths by a controlled amount. Designing slightly different sample periods, and therefore reflectivity peak spacings, between the two mirror 102, 108 results in a Vernier effect, wherein only a single set of peaks have significant overlap for any given amount of tuning. In conjunction with this, there exists a cavity mode spectrum that describes which possible wavelengths satisfy the round trip phase condition necessary for laser oscillation, typically spaced at <1 nm.

The combination of front and back mirror 102, 108 currents with best overlap selects a cavity mode at which lasing occurs, the phase 106 current fine-tunes the cavity mode's wavelength, and the gain 104 current controls the output power. For optical communications applications, this means that a distinct combination of four currents can be used to access any of 100 or more wavelength channels, such as those standardized by the International Telecommunications Union (ITU) and which lie on a 50 GHz or 100 GHz frequency grid. Because of variations in fabrication process, the mirror 102, 108 currents to achieve a particular wavelength are slightly different for each fabricated laser 100, and thus each laser 100 must be properly calibrated before installation.

Figure 3:
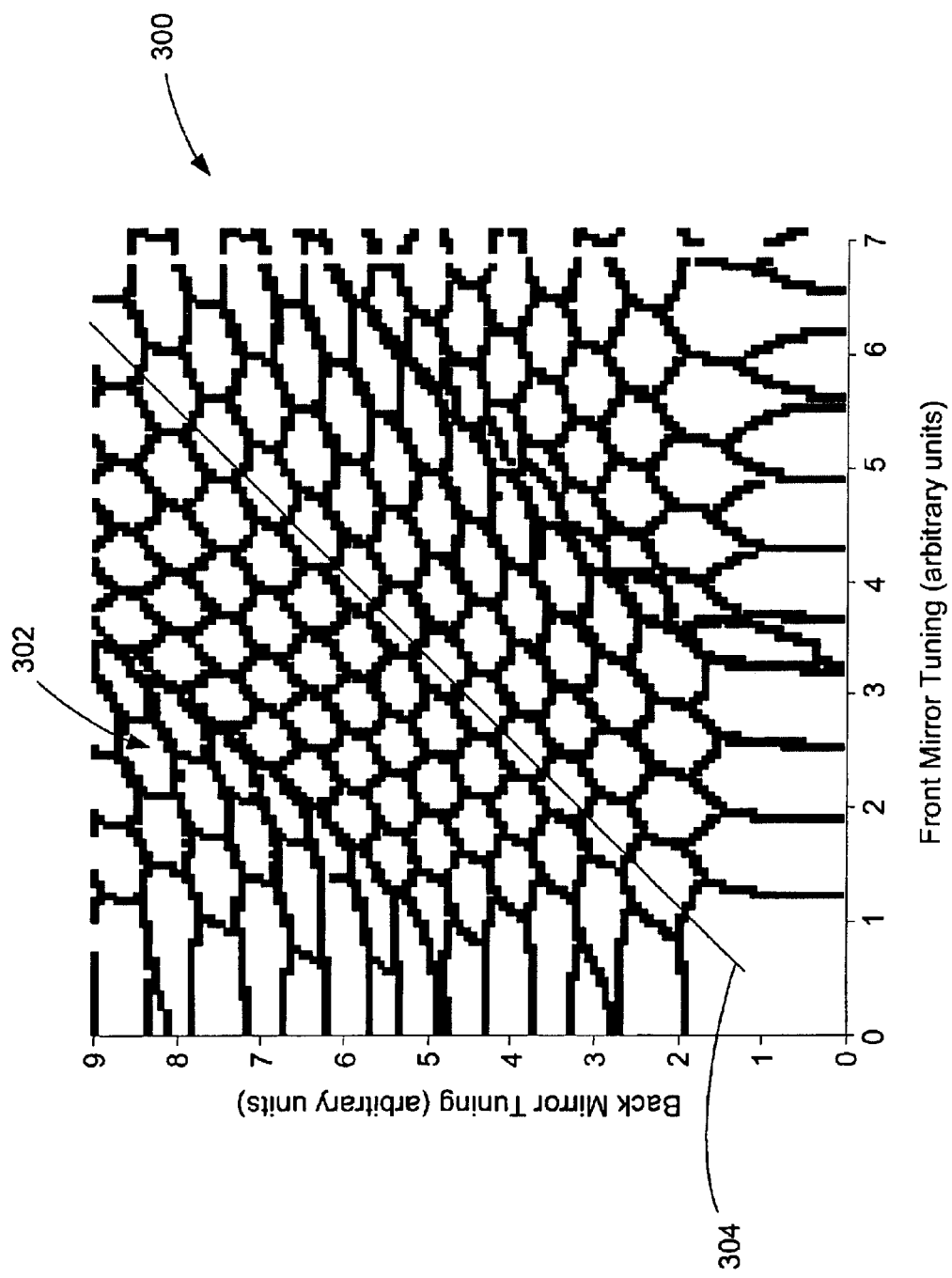
FIG. 3 is a graph that illustrates a mode map for a sampled-grating distributed Bragg reflector laser.

FIG. 3 is a graph that illustrates a mode map 300 for a SGDBR laser 100. The mode map 300 comprises a two dimensional plot of the front and back mirror 102, 108 currents, or some linearized mapping thereof. Mode maps 300 are typically obtained by exhaustive raster scanning of both front and back mirror 102, 108 currents, while holding the other sections 104, 106 fixed or under feedback control.

Each cell-like area in the graph is a cavity mode 302, wherein adjacent cavity modes 302 lying along a diagonal are accessed by the same set of mirror 102, 108 peaks and are called supermodes 304. The graph illustrates boundaries between cavity modes 300, which are separated by discontinuities in device characteristics or their derivatives, such as external parameters of wavelength, output power, etc., or internal parameters of voltage for constant current-driven sections, current for constant voltage-driven sections, or either current or voltage for sections driven under additional feedback control. The graph may also include characteristics such as wavelength, power, voltage, etc., associated with all points in the space or with some sampling thereof, such as the center point of each cavity mode 302.

A first embodiment of the present invention is a method performed by the control electronics 110 that reliably switches between initial and target channels by counting intermediate cavity mode 302 boundaries or hops. Cavity mode 302 boundaries or hops can be quickly detected using internal techniques, such as discontinuities in gain, phase, or amplifier section voltages, as front and back mirror 102, 108 currents are ramped in a coordinated fashion from the initial channel to the target channel. Comparing the "as-measured" location of cavity mode boundaries or hops with the cavity mode 302 boundaries or hops in the mode map 300, which is obtained at a time zero calibration, results in incremental corrections to the path leading from the initial channel to the target channel. In other words, the front and back mirror 102, 108 currents at the target channel are locked in a relative sense to those of the initial channel through intermediate cavity modes 302 on the mode map 300. The technique includes methods for choosing a path from the initial channel to the target channel that robustly converts nonlinear motion to self-correcting feedback for both the front and back mirrors 102, 108.

A second embodiment of the present invention is a method performed by the control electronics 110 utilizing an external feedback signal from the global channel monitor 116 that is monotonically related to the wavelength of the output beam of the laser 100. [3] Mode maps 300 in this embodiment are organized in a similar way to the first embodiment. However, instead of ramping the front and back mirror 102, 108 currents in a continuous fashion while monitoring for cavity mode 302 boundaries or hops, the currents are switched instantaneously to an estimate of the front and back mirror 102, 108 currents for the target channel, the wavelength of the output beam is measured by the global channel monitor 116, and a wavelength error is converted to separate current corrections for the front and back mirrors 102, 108. The method uses a time zero calibration to convert the measured wavelength error into separate front and back mirror 102, 108 current corrections for proper target channel acquisition under switching operation.

Both embodiments have the promise of being fast enough (~10 msec) for market applications. The cavity mode 302 counting approach, using feedback signals from the gain section 104 voltage or current, or voltages or currents from other sections of the laser 100, can furthermore be performed with the laser 100 output blanked, by using an on-chip semiconductor-optical-amplifier (SOA) gate. This has the advantage of eliminating channel-switch-induced-crosstalk, which may be an issue in many networking architectures.

Switching Control Based on Mode Counting

During a channel switch, the front and back mirror 102, 108 currents move in a coordinated manner to induce cavity mode 302 hops with the phase 106 current held constant. Parameters for coordinating this movement are determined at calibration by processing an open-loop (constant phase) mode map 300 and then downloading the parameters (i.e., wavelength of a target channel, corresponding front mirror 102 current and corresponding back mirror 108 current) into the control electronics 110. Comparing the positions of cavity mode boundaries measured during operation of the laser 100 with the cavity mode 302 boundaries from the mode map 300 provides a feedback signal that can correct for aging-induced changes in the mirrors 102, 108 tuning efficiencies.

Channel switches do not occur as a discontinuous translation in a tuning-current 3-space (i.e., wavelength of a target channel, corresponding front mirror 102 current and corresponding back mirror 108 current), nor does cavity mode 302 counting necessarily occur as a straight-line interpolation between initial and target channels. Instead, there is a recipe for movement from one channel to another based on intermediate motion through one or more cavity mode 302 centers.

This nonlinear mirror 102, 108 current motion is of three types:

Slide: Continuous movement along a particular (positive diagonal) supermode 304 trajectory. Trajectories are smooth parametric curve fits connecting cavity mode 302 centers along a particular supermode 304. Distance in the mode map 300 is counted in terms of cavity mode 302 hops. One unit distance should ideally consist of half a cavity mode 302 spacing, followed by a cavity mode 302 hop (which may be detected by the power monitor 112 as a gain voltage or output power cusp, for example), followed by another half cavity mode 302 spacing. Non-integral cavity mode 302 spacings are estimated, but any distance more than one cavity mode 302 spacing away can by corrected in the longitudinal direction, with an unknown error transverse to the trajectory. There is a subtype known as a fractional slide, which occurs immediately before achieving the target channel, when motion of less than one cavity mode 302 spacing is required, coupled with a change in the phase section 106 current, to achieve the cavity mode 302 center.

Side-slide: Continuous movement transverse to a supermode 304 trajectory. In general, every cavity mode 302 has six neighboring cavity modes 302 in the mode map 300, wherein two neighboring cavity modes 302 are part of the same supermode 304 trajectory, two neighboring cavity modes 302 are transverse with change in front mirror 102 current but little change in the back mirror 108 current (for hexagonal mode-staggered designs), and two neighboring cavity modes 302 are on a transverse negative-sloped diagonal. Motion along these transverse-connected trajectories is a side-slide. A side-slide with a small change in the front mirror 102 current is known as a front mirror 102 side-slide; while the other type is a negative-diagonal side-slide. For a negative-diagonal side-slide, the error will build up in the supermode 304 trajectory direction, but transverse-direction movement will be self-correcting through cavity mode 302 counting. A side-slide in the front mirror 102 current will mainly correct the error therein, with little correction in the back mirror 108 current.

Jump: Discontinuous movement from the center of one cavity mode 302 to the center of another cavity mode 302. No cavity mode 302 boundaries are detected. This type of motion is not self-correcting. However, it is useful for navigating through a repeat mode transition (described below), where many irregular or small-shaped cavity modes 302 are present that could result in a mis-count.

Figure 4:
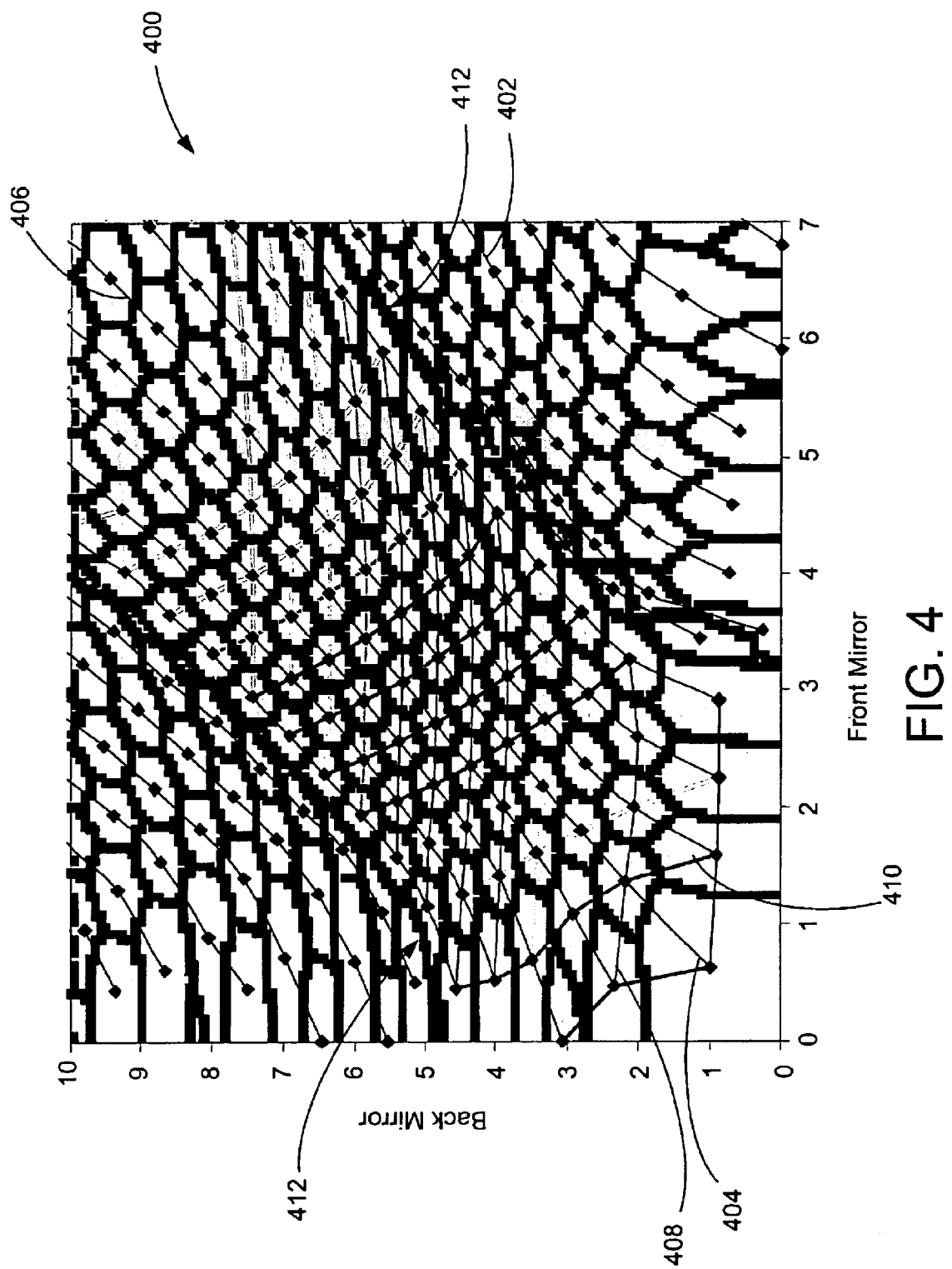
FIG. 4 is a mode map that illustrates three types of motion and their trajectories in the context of cavity modes and supermodes.

FIG. 4 is a mode map 400 that illustrates these three types of motion and their trajectories in the context of cavity modes 402 and supermodes 404. Specifically, FIG. 4 is trajectorized into supermode 404 slides 406 and side-slides 408, 410. Diagonally-sloped repeat mode 412 transitions are also indicated, which separate the main portion of the map 400 from the upper left and lower right corners.

Slides 406 occur along the black diagonal trajectories, and side-slides 408, 410 along the indicated trajectories (thin-lines are negative diagonal side-slides 408, and thick lines are front mirror 102 side-slides 410). Additional side-slide 408, 410 trajectories in the upper left and lower right portions of the map 400 are not pictured. These additional trajectories would be jumped to/from based on the end points of the side-slide 408, 410 trajectories that are shown.

Although FIG. 4 shows a constant phase mode map 400 with a discrete set of side-slide 408, 410 trajectories, it is recognized that these transverse trajectories will translate in the positive diagonal direction as a function of phase 106 current. Therefore, to generalize for all phase 106 currents, these side-slide 408, 410 trajectories must form a continuum, so that any point along a continuous supermode 404 trajectory (i.e., not limited to a particular phase 106 current's cavity mode 402 centers) will have a set of vectors describing motion by side-slide 408, 410 or jump to neighboring supermode 404 trajectories.

In general, motion of any one type may generate errors in one or more dimensions as a result of device 100 aging. For example, if there is a maximum specification on the increase in mirror 102, 108 current due to aging of 35% (corresponding to roughly 1.5 full cavity mode 402 spacings out of 12 in the supermode 404 direction), the maximum uncorrected change in current can be computed before an unintended cavity mode hop is imminent (using ~+/−0.33 mode spacing for a safety margin). Cavity mode 402 counting along the positive-sloped or negative-sloped diagonals is most susceptible to asymmetric aging of a single section only.

Given this scenario, assuming asymmetric aging of 1.5 out of 12 on a single mirror 102, 108 requires a transverse-correcting side-slide 408, 410 after a slide 406 of three cavity mode 402 spacings. Geometrical considerations on the other directions result in similar motion rules, wherein a motion rule is a constraint on the maximum distance that can robustly be traveled in one direction before movement in an orthogonal direction is required. Finally, a jump of three cavity mode 402 spacings requires a slide 406 immediately followed by a side-slide 408, 410, in order to correct for errors in two dimensions. (This is nearly the equivalent of a fast re-center, but allows for forward advancement to the target channel at the same time).

In switching from the initial channel to the target channel, the present invention will undergo transitions following the above motion rules until the device 100 is within a fraction of a cavity mode 402 spacing from the target channel. At this point, the present invention is finally allowed to "dead-reckon" interpolate and/or jump to the final set of front and back mirror 102, 108 currents, set the phase 106 current, and turn on the wavelength locking control 122 loop with feedback from the wavelength locker 114.

Figure 5:
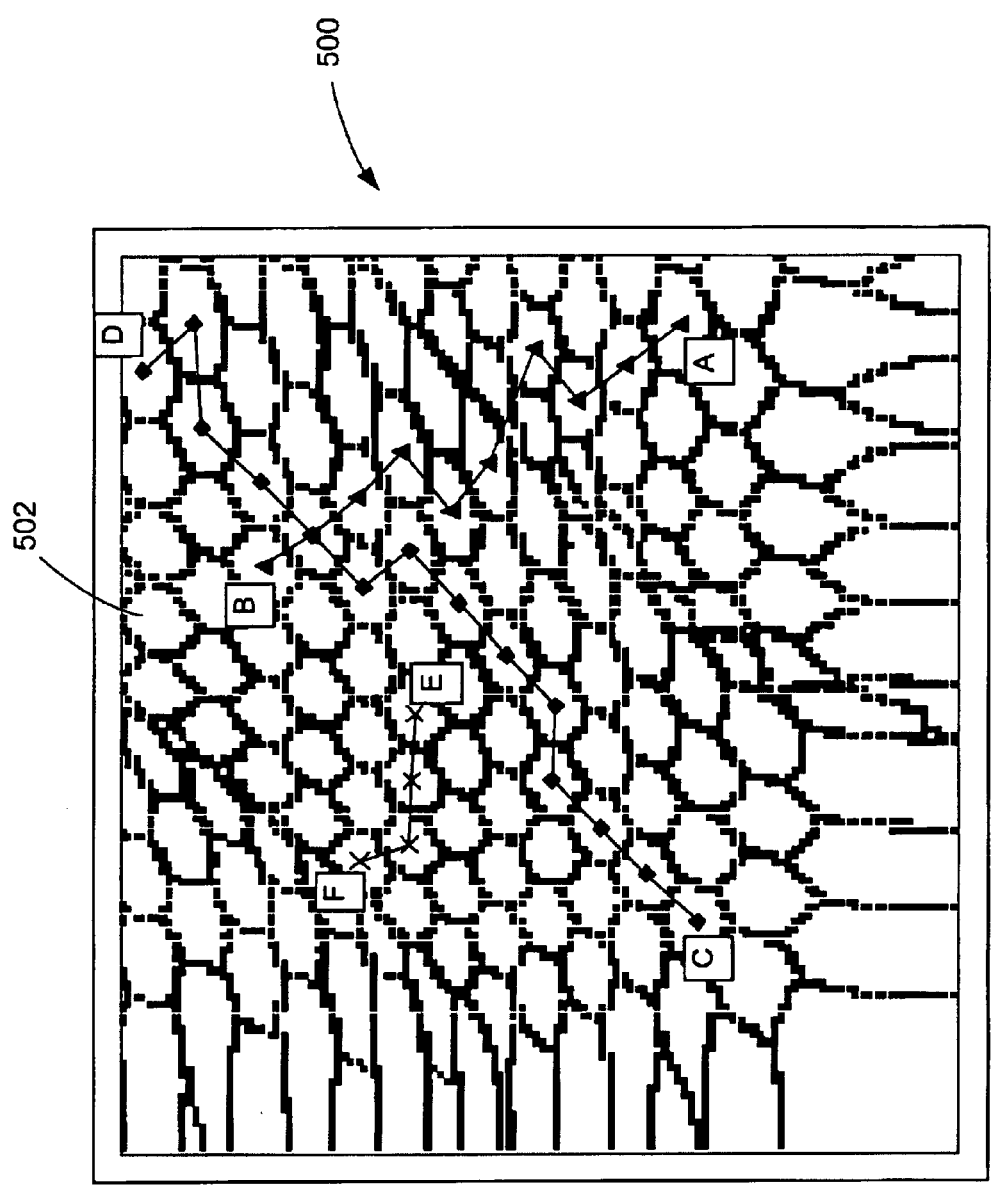
FIG. 5 is a mode map that depicts examples of paths from cavity mode to cavity mode, wherein several paths are shown through the mode map from a cavity mode associated with the initial channel to a cavity mode associated with the target channel.

FIG. 5 is a mode map 500 that depicts examples of paths from cavity mode 502 to cavity mode 502, wherein several paths are shown through the mode map 500 from a cavity mode 502 associated with the initial channel to a cavity mode 502 associated with the target channel. On path A–B, where the steps are indicated by triangles, the fourth step is a discontinuous jump across the repeat mode transition to bypass odd-sized cavity modes 502. Path C–D, where the steps are indicated by squares, shows that even though C and D lie on the same trajectory, the path connecting them must wander in order to self-correct properly. Path E–F, where the steps are indicated by crosses, is straightforward.

The key to making this technique work is to come up with a simple algorithm to generate motion-rule-adhering paths from the initial channel to the target channel, either on the fly or from encoded paths stored in a memory of the control electronics 110 (which would require, for example, enough memory to store a wavelength of a channel, its corresponding front mirror 102 current and corresponding back mirror 108 current for 100 initial channels×100 target channels or $10^4$ records). Furthermore, the present invention must make small enough steps to allow cavity mode counting to work. It can be estimated that approximately 100–150 steps may be required to traverse from the cavity mode associated with the initial channel to the cavity mode associated with the destination mode, if no motion rules are applied, with perhaps an additional 25% to account for motion rules.

Figure 6:
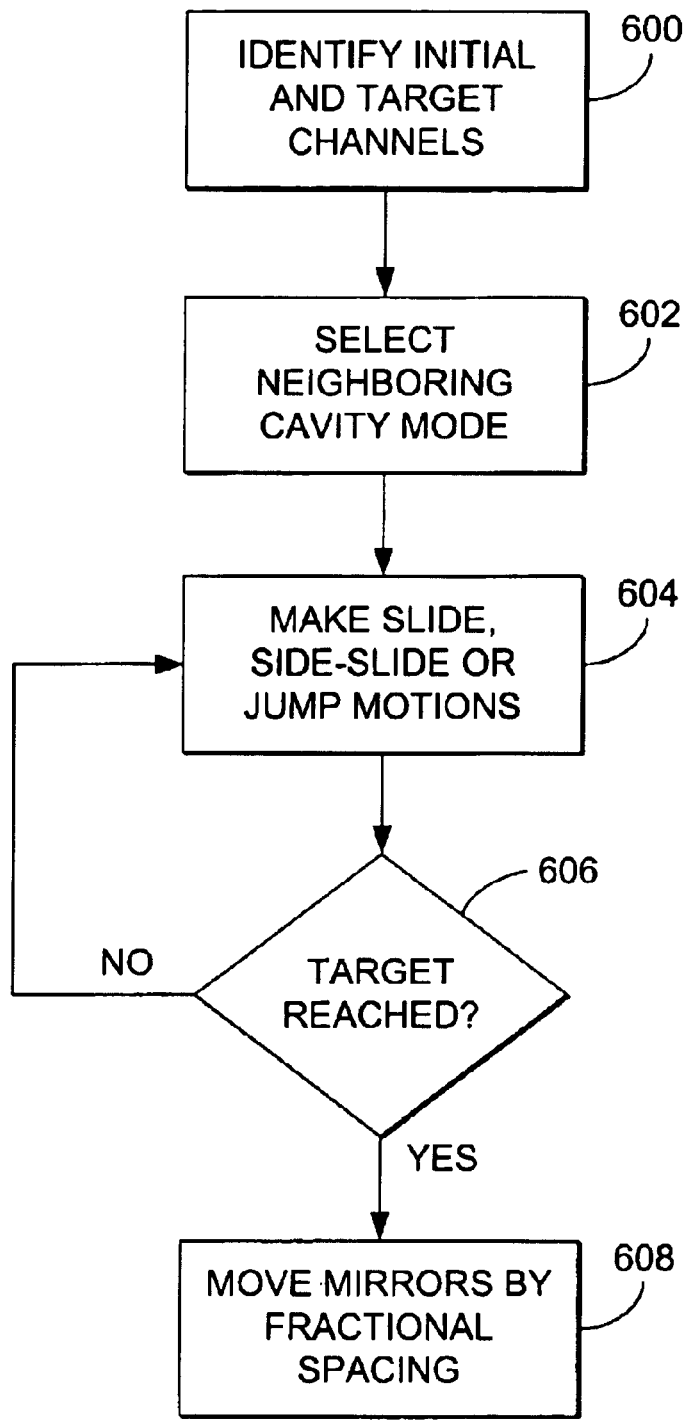
FIG. 6 is a flowchart that illustrates path selection logic according to an embodiment of the present invention.

FIG. 6 is a flowchart that illustrates the logic for path selection performed by the control electronics 110, based on a time zero open loop (constant gain 104 and constant phase 106 currents) mode map.

Block 600 represents identifying initial and target channels on their respective supermode trajectories, and identifying the location of the cavity mode nearest the target channel that corresponds to the phase 106 current at the initial channel. This can be aided by assigning each ITU grid operating point location a fractional cavity mode separation from a reference constant-phase map at a time zero calibration.

Block 602 represents, starting at the cavity mode for the initial channel, selecting the one of six neighboring cavity modes that is closest in distance to the cavity mode of the target channel.

Block 604 represents making appropriate slide/side-slide/jump motions to the selected cavity mode, and updating counters for consecutive translations in the same direction, so that the motion rules can be followed.

Block 606 is a decision block that determines whether the cavity mode associated with the target channel has been reached. If not, control loops to Block 602 to continue the logic from the current cavity mode; otherwise, control transfers to Block 608.

Block 608 represents the front and back mirrors 102, 108 being moved by fractional cavity mode spacing to obtain the target channel.

During the channel switch, nearest neighbor vectors on the time zero mode map are used as the guide for translations on the real aged device 100. However, the relationship (difference) between the current location in mirror space on the real aged device 100 and on the time zero calibrated mode map will be corrected as each cavity mode boundary is detected. This correction vector will be constrained to have the same direction as that of the motion itself (slide/side-slide/jump), but with an amplitude equal to the difference between the mode map's cavity mode boundary and the "as-detected" cavity mode boundary. More refined higher-order correction schemes are also possible, based on a model for expansion of the mode map in addition to translation.

Distance as used here could be computed in a number of ways: straight-line mode map distance, sum of deltas in slide or side-slide number (if trajectories are numbered in the same order as they appear on the mode map), or more complicated schemes, such as a weighted combination of the above.

An alternative embodiment of the present invention is the "fast re-centering" concept of using cavity mode boundary detection to allow fast re-centering within the cavity mode. Rather than using a combination of self-correcting slides, side-slides, or jumps to reach the target channel, the front and back mirror section 102, 108 currents are switched discontinuously to one or more cavity modes intermediate between the initial and target channels—in other words, only jumps are used. After each jump to an intermediate cavity mode (or even the target channel itself), the front and back mirror 102, 108 currents are dithered about their set points, along either mirror 102, 108 axis, and cavity mode boundaries are detected. A new estimate of the cavity mode center is calculated to provide a correction to the set point currents of subsequent jumps.

Another alternative embodiment of the present invention is the "touchdown" concept. The front and back mirror 102, 108 currents need not be ramped continuously from cavity mode center to cavity mode center. As soon as a cavity mode boundary is detected, the currents for the front and back mirrors 102, 108 may be switched discontinuously to be proximate to the next expected cavity mode boundary. Provided there is enough of a margin of distance on either side to assure proper mode cavity boundary detection, the number of points that need to be sampled can be significantly reduced.

Switching Control Based on a Global Locker

The global channel monitor 116 provides an analog feedback signal corresponding to the lasing wavelength of the laser 100. The present invention proposes a simple method performed by the control electronics 110, based on a time zero trajectorized mirror calibration, used in conjunction with feedback from the global channel monitor 116, to provide fast, robust channel switching.

Figure 7:
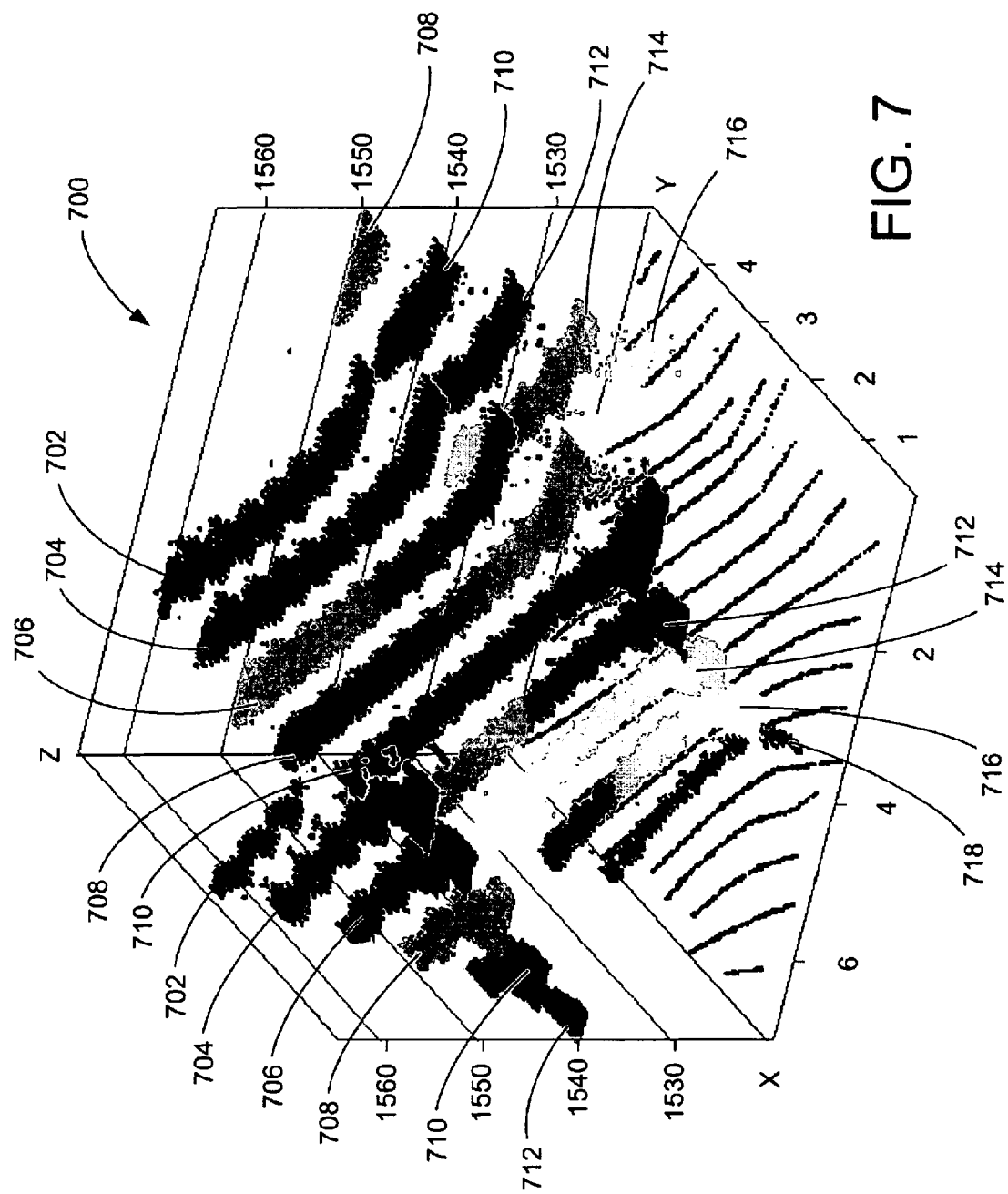
FIG. 7 illustrates a time zero open loop (constant gain and constant phase currents) mode map of a sampled-grating distributed Bragg reflector laser as three dimensional plot of wavelength vs. front and back mirror currents.

FIG. 7 illustrates a time zero open loop (constant gain 104 and constant phase 106 currents) mode map 700 of a SGDBR laser 100 as three dimensional plot 702–718 of wavelength vs. front and back mirror 102, 108 currents, wherein the x and y axes of the plot identify the trajectories connecting cavity mode centers along each supermode and the z (or vertical) axis identifies the wavelength.

Trajectories in [Ifm,Ibm] space connecting cavity modes along a supermode are shown in the curves on the x and y axes, where Ifm is front mirror 102 current and Ibm is the back mirror 108 current, or linearizations thereof with respect to mirror tuning. It is presumed that the lasing wavelength at a cavity mode center corresponds to the best estimate of the Bragg mirror wavelength for the two mirror 102, 108 currents at cavity mode center, and so this subset of trajectory data can be replotted as a function wavelength, as shown in FIG. 8.

Figure 8:
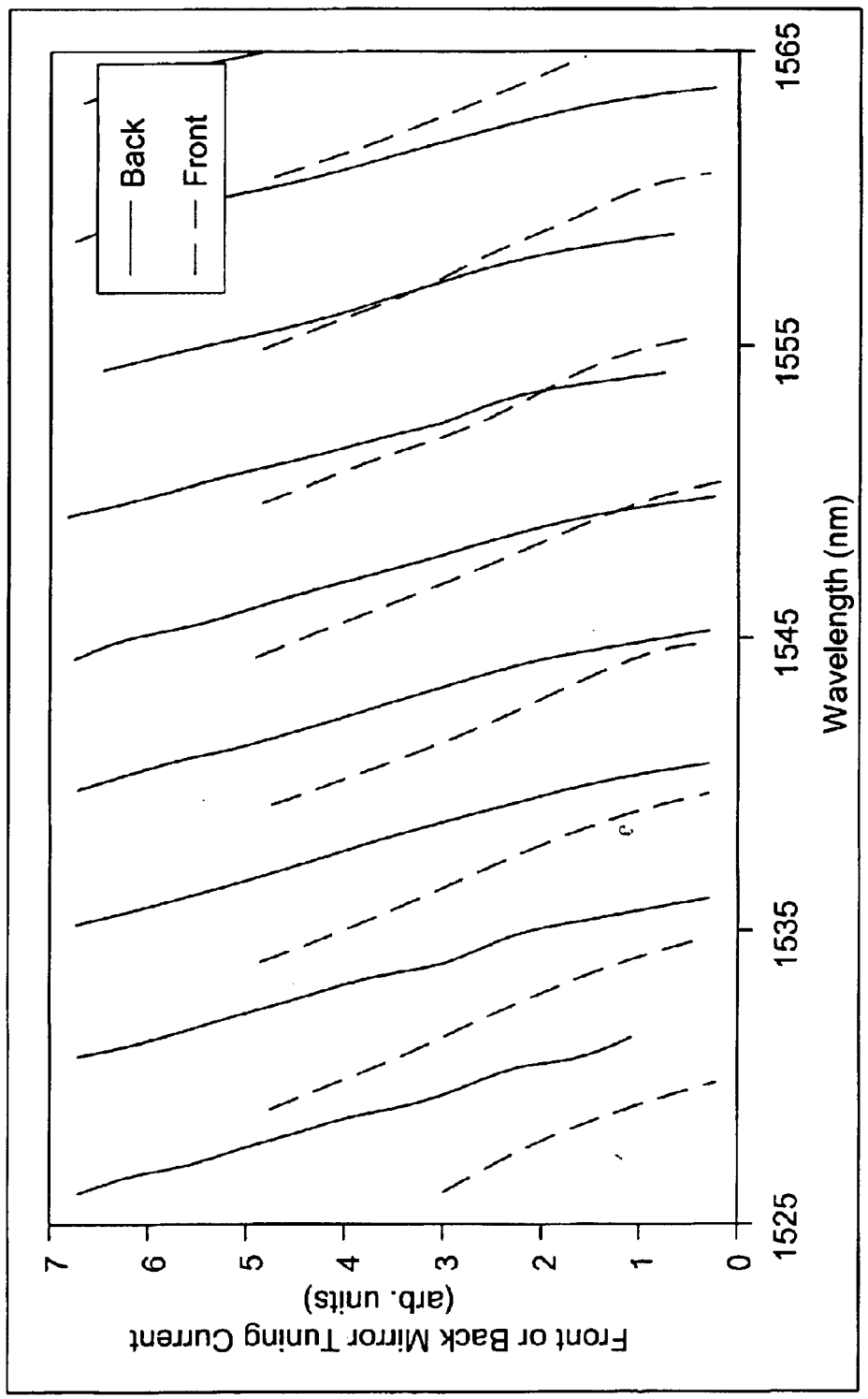
FIG. 8 illustrates the mode map data re-plotted as mirror tuning vs. measured wavelength at cavity mode center.

FIG. 8 illustrates the mode map data re-plotted as mirror tuning vs. measured wavelength at cavity mode center. This is the equivalent of a lookup table to convert wavelength into time zero front and back mirror 102, 108 currents. Notice that the currents are not single-valued. Instead, there can be multiple ways to achieve the same lasing wavelength, even if the device 100 is constrained to operate at cavity mode center.

This trajectorized data (i.e., [Ifm, Ibm, $\lambda$]) forms the basis of the time zero lookup table downloaded into the control electronics 110. In addition, the control electronics 110 includes a calibration table that maps a feedback signal g from the global channel monitor 116 to the wavelength $\lambda$ (i.e. [g, $\lambda$]). It is assumed that the feedback signal g is a smooth, quasi-linear function of the wavelength $\lambda$, which provides a mapping of [Ifm, Ibm, g] that can be interpolated to yield time zero mirror 102, 108 currents Ifm and Ibm for any feedback signal g. Note also that this mapping is most accurate if the feedback signal g is measured at a cavity mode center, since wavelength varies within the cavity mode over a range of roughly 100 pm as a function of detuning from the Bragg condition.

Figure 9:
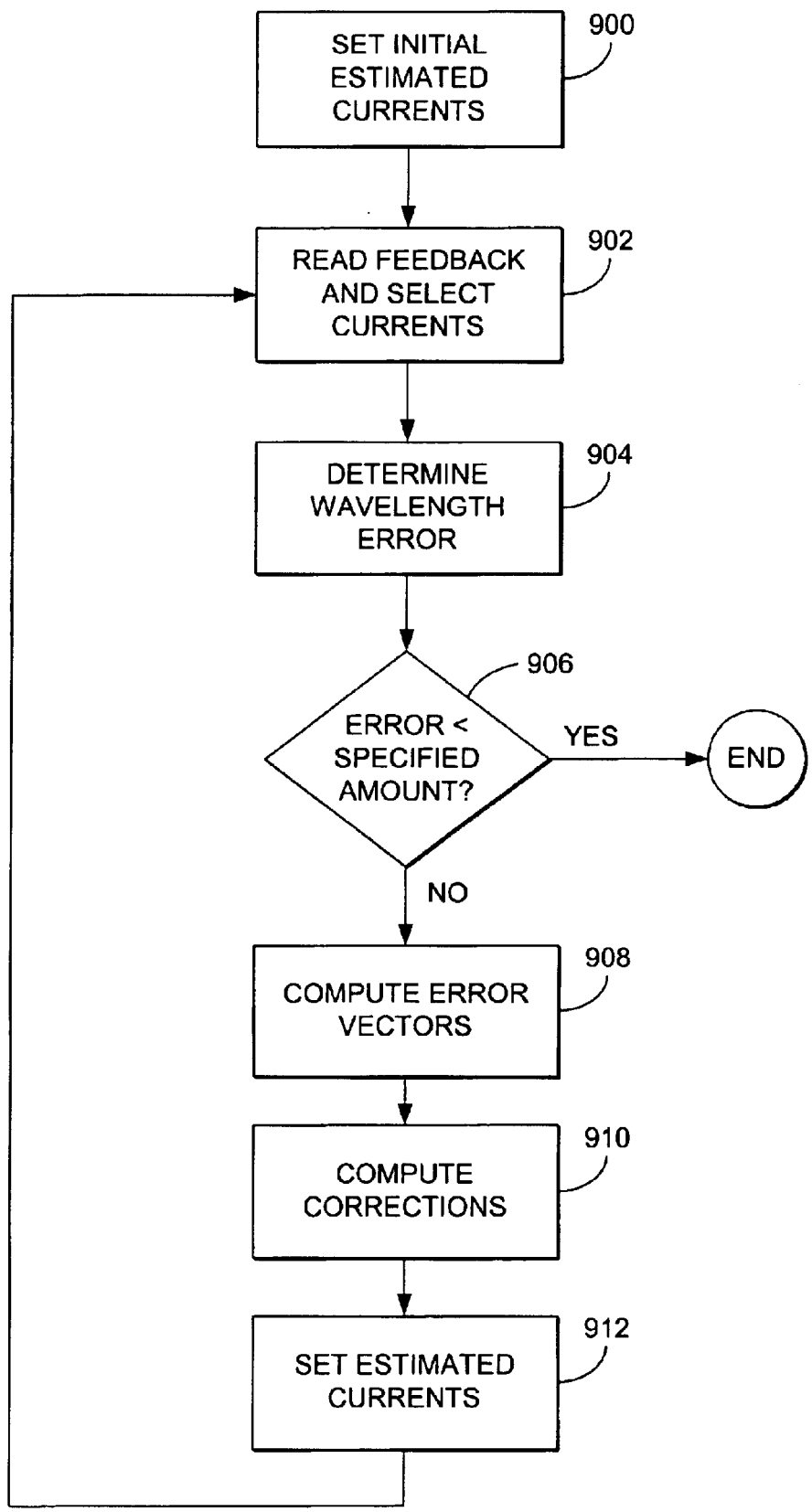
FIG. 9 is a flowchart that illustrates channel switching logic according to an embodiment of the present invention.

FIG. 9 is a flowchart that illustrates the channel switching logic performed by the control electronics 110 and suggested by the above discussion.

Block 900 represents the setting of the initial estimated mirror 102, 108 and phase 106 currents $Ifm_{est}$, $Ibm_{est}$, $Iph_{est}$ for the target channel, where $Ifm_{est}$ is the estimated front mirror 102 current, $Ibm_{est}$ is the estimated back mirror 108 current, and $Iph_{est}$ is the estimated phase 106 current.

Block 902 represents the reading of the feedback signal g and interpolating the feedback signal g to select the corresponding time zero calibrated mirror currents $Ifm_0$ and $Ibm_0$, without closing the loop on phase 106 current. When multiple [Ifm,Ibm] solutions are present for the same feedback signal g, this Block represents selecting the time zero calibrated mirror currents $Ifm_0$ and $Ibm_0$ closest in mirror space to the target channel.

Block 904 represents the wavelength error being determined from the feedback signal.

Block 906 is a decision block that determines whether the wavelength error is less than a specified amount (e.g., if the wavelength error <100 pm). If so, then the logic terminates; otherwise, control transfers to Block 908.

Block 908 represents the error vectors for the front and back mirror 102, 108 currents being computed:

$\Delta Ifm = Ifm_{est} - Ifm_0$ $\Delta Ibm = Ibm_{est} - Ibm_0$

Block 910 represents first order corrections for the front and back mirror 102, 108 currents being computed:

$$Ifm_{est}'=Ifm_{est}+\Delta ifm$$

$$Ibm_{est}'=Ibm_{est}+\Delta Ibm$$

Block 912 represents the estimated front mirror 102 current $Ifm_{est}$ and the estimated back mirror 108 current $Ibm_{est}$ being set to the first order corrections $Ifm_{est}'$ and $Ibm_{est}'$, respectively. Thereafter, control transfers back to Block 902 to repeat the logic.

Completion of this global locking loop using the global channel monitor 116 would be followed by wavelength locking to the ITU grid using a 50 GHz etalon-type wavelength locker 114.

The global locking loop can be made more accurate using one or more of the following additional steps:

Mode re-centering following Block 902: Upon jumping to the new estimated target currents (Block 902), perform a mirror 102, 108 dither with cavity mode boundary detection to re-center within the cavity mode. This forces the lasing wavelength to match the mirror 102, 108 Bragg wavelengths in order to result in the most accurate calculation of $Ifm_0$ and $Ibm_0$. Alternatively, since cavity mode re-centering may be a lengthy process (several milliseconds), it can be performed once during the last iteration of the loop, rather than at every iteration.

Aging model assistance following Block 910: Block 910 corrects for a local translation of the mode map rather than an expansion. If the required correction is small, translation correction is nearly equal to expansion correction. However, if it is assumed that the wavelength error is a result of mirror 102, 108 aging, the present invention can compute a second order correction for the estimated front and back mirror 102, 108 currents based on the aging model, according to the following expression:

$$\Delta Ifm/(Ifm_0)^p=(Ifm_{est}'-Ifm_{est})/(Ifm_{est})^p$$

and then setting the estimated front mirror current $Ifm_{est}$ and the estimated back mirror current $Ibm_{est}$ to the second order corrections.

The above expression is used to calculate a more refined estimate of the correction, where p is obtained empirically for a given device 100 design. Notice that as p goes to zero, or as $Ifm_{est0}$ approaches $Ifm_{est0}$, the refined correction approaches the first order model from Block 908. Thus, the aging model need not be as accurate since it will be applied primarily between a cavity mode very close to the cavity mode of the target channel, rather than being forced to predict mode movement at opposite ends of the mode map.

Finally, a further requirement for this procedure to work is the exhaustive trajectorization of mirror space. There may be several supermodes, particularly those near the repeat mode hop, that are too unreliable to use as operating channels because of small or mis-shaped mode areas. However, they will still need to be trajectorized, since there will be the possibility that they are jumped to through intermediate iterations of the control loop.

Moreover, certain pathological mode maps will not be allowed, particularly those that have supermodes of identical wavelength coverage closely space together (e.g. within two modes of each other). In those cases, the algorithm could be presented with multiple [Ifm, Ibm] interpolated values that are not clearly resolved, leading to erroneous and unstable corrections.

Finally, thermal transients would have to be properly managed, since they would be corrected for at the time of global locking (immediately after channel switch), leading to a steady state error upon wavelength locking and cooldown. Provided that the thermal transient inaccuracy is consistent with the accuracy of global locking and the requirements for mirror locking, it may be ignored.

To make the global locking worthwhile, it would need to be accurate to within two-thirds of the mode diameter, or roughly +/−120 pm. Its accuracy could presumably be complimented with a 100 Ghz or 50 Ghz etalon-type wavelength locker 114.

REFERENCES

The following two publications and patent are incorporated by reference herein:

[1] H. Mawatari, M. Fukuda, F. Kano, Y. Tohmori, Y. Yoshikuni, and H. Toba, "Lasing Wavelength Changes Due to Degradation in Buried Heterostructure Distributed Bragg Reflector Lasers," IEEE J. Lightwave Technology, vol. 17, no. 5, pp. 918–923, May 1999.

[2] V. Jayaraman, A. Mathur, L. A. Coldren and P. D. Dapkus, "Theory, Design, and Performance of Extended Tuning Range in Sampled Grating DBR Lasers," IEEE J. Quantum Elec., vol. 29, no. 6, pp. 1824–1834, June 1993.

[3] PCT Patent Application Ser. No. PCT/US00/05235, filed on Feb. 29, 2000, by Larry A. Coldren, Thomas Gordon Beck Mason, and Gregory A. Fish, entitled "A Tunable Laser Source with an Integrated Wavelength Monitor and Method of Operating Same," which application claims priority to U.S. Provisional Application Ser. No. 60/122,194, filed on Mar. 1, 1999, by Larry A. Coldren, Gregory A. Fish, and Thomas Gordon Beck Mason, entitled "Tunable Laser Source With Integrated Wavelength Monitor."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of switching an output wavelength of a multi-section laser containing two or more current-controlled, tunable, wavelength-selective elements, comprising:

(a) selecting front and back mirror currents for the laser to tune the laser's output to a wavelength of a target channel based on a feedback signal combined with a mode map, wherein the feedback signal results from a selection of one or more sets of tuning currents intermediate between those of an initial channel and the target channel, and the mode map comprises a two-dimensional grouping of the front and back mirror currents corresponding to cavity modes of the laser as measured at an earlier time.

2. The method of claim 1, further comprising classifying and organizing the two-dimensional plot of the front and back mirror currents in order to translate the feedback signal into separate corrections for the front and back mirror currents.

3. The method of claim 1, wherein the feedback signal is generated by internal or external means.

4. The method of claim 1, wherein the selecting step is performed by counting cavity mode boundaries or hops.

5. The method of claim 4, wherein the feedback signal identifies mirror currents at which cavity mode boundaries or hops occur.

6. The method of claim 5, wherein the identified cavity mode boundaries or hops are compared to the mode map cavity mode boundaries in order to provide incremental corrections to a path from the initial channel to the target channel.

7. The method of claim 6, further comprising choosing the path from the initial channel to the target channel that converts nonlinear motion to self-correcting feedback for the front and back mirrors of the laser.

8. The method of claim 1, further comprising:
   (1) identifying cavity modes for the initial channel and the target channel on their respective supermode trajectories in the mode map;
   (2) starting at the cavity mode for the initial channel, traversing the mode map to the cavity mode for the target channel; and
   (3) altering the front and back mirror currents according to the traversed mode map.

9. The method of claim 8, further comprising altering the front and back mirror currents by fractional cavity mode spacing to obtain the target channel.

10. The method of claim 8, wherein the traversing step (2) uses one or more slides, side-slides or jumps.

11. The method of claim 10, wherein the slide is a continuous movement along a positive diagonal supermode trajectory of the mode map.

12. The method of claim 10, wherein the side-slide is a continuous movement transverse to a supermode trajectory of the mode map.

13. The method of claim 10, wherein the jump is a discontinuous movement from mode center to mode center in the mode map.

14. The method of claim 1, further comprising generating a correction vector from the mode map cavity mode boundaries and detected cavity mode boundaries.

15. The method of claim 1, further comprising using cavity mode boundary detection to allow fast re-centering within the cavity mode.

16. The method of claim 1, further comprising switching the front and back mirror currents discontinuously when a cavity mode boundary is detected.

17. The method of claim 1, further comprising:
   (1) setting the front and back mirror currents to an estimate of the target channel's mirror currents,
   (2) measuring the wavelength of the output beam to determine a wavelength error resulting from the setting step; and
   (3) converting the wavelength error to corrections for the front and back mirror currents.

18. The method of claim 1, further comprising:
   (1) setting an initial estimated front mirror current $Ifm_{est}$, estimated front mirror current $Ibm_{est}$, and phase section currents $Iph_{est}$ for the wavelength of the target channel;
   (2) generating a time zero calibrated front mirror current $Ifm_0$ and a time zero calibrated front mirror current $Ibm_0$ from the feedback signal;
   (3) determining a wavelength error from the feedback signal and terminating the method when the wavelength error is less than a specified amount;
   (4) computing error vectors for the front and back mirror currents:

$$\Delta Ifm = Ifm_{est} - Ifm_0$$
   $$\Delta Ibm = Ibm_{est} - Ibm_0$$

(5) computing first order corrections for the front and back mirror currents:

$$Ifm_{est}' = Ifm_{est} + \Delta Ifm$$
   $$Ibm_{est}' = Ibm_{est} + \Delta Ibm$$

(6) setting the estimated front mirror current $Ifm_{est}$ and the estimated front mirror current $Ibm_{est}$ to the first order corrections $Ifm_{est}'$ and $Ibm_{est}'$;
   (7) repeating from step (2).

19. The method of claim 18, further comprising dithering the front and back mirror currents in accordance with cavity mode boundary detection to re-center within the cavity mode.

20. The method of claim 18, further comprising computing second order corrections for the front and back mirror currents based on an aging model and setting the estimated front mirror current $Ifm_{est}$ and the estimated back mirror current $Ibm_{est}$ to the second order corrections.

21. An apparatus for switching an output wavelength of a multi-section laser containing two or more current-controlled, tunable, wavelength-selective elements, comprising:
   (a) a multi-section laser containing two or more current-controlled, tunable, wavelength-selective elements; and
   (b) means for selecting front and back mirror currents to tune the laser output to a wavelength of a target channel based on a feedback signal combined with a mode map, wherein the feedback signal results from a selection of one or more sets of tuning currents intermediate between those of an initial channel and the target channel, and the mode map comprises a two-dimensional grouping of the front and back mirror currents corresponding to cavity modes of the laser as measured at an earlier time.

22. The apparatus of claim 21, further comprising means for classifying and organizing the two-dimensional plot of the front and back mirror currents in order to translate the feedback signal into separate corrections for the front and back mirror currents.

23. The apparatus of claim 21, wherein the feedback signal is generated by internal or external means.

24. The apparatus of claim 21, wherein the means for selecting comprises means for counting cavity mode boundaries or hops.

25. The apparatus of claim 24, wherein the feedback signal identifies mirror currents at which cavity mode boundaries or hops occur.

26. The apparatus of claim 25, wherein the identified cavity mode boundaries or hops are compared to the mode map cavity mode boundaries in order to provide incremental corrections to a path from the initial channel to the target channel.

27. The apparatus of claim 26, further comprises means for choosing the path from the initial channel to the target channel that converts nonlinear motion to self-correcting feedback for the front and back mirrors of the laser.

28. The apparatus of claim 21, further comprising means for:
   (1) identifying cavity modes for the initial channel and the target channel on their respective supermode trajectories in the mode map;
   (2) starting at the cavity mode for the initial channel, traversing the mode map to the cavity mode for the target channel; and
   (3) altering the front and back mirror currents according to the traversed mode map.

29. The apparatus of claim 28, further comprising means for altering the front and back mirror currents by fractional cavity mode spacing to obtain the target channel.

30. The apparatus of claim 28, wherein the means for traversing (2) uses one or more slides, side-slides or jumps.

31. The apparatus of claim 30, wherein the slide is a continuous movement along a positive diagonal supermode trajectory of the mode map.

32. The apparatus of claim 30, wherein the side-slide is a continuous movement transverse to a supermode trajectory of the mode map.

33. The apparatus of claim 30, wherein the jump is a discontinuous movement from mode center to mode center in the mode map.

34. The apparatus of claim 21, further comprising means for generating a correction vector from the mode map cavity mode boundaries and detected cavity mode boundaries.

35. The apparatus of claim 21, further comprising means for using cavity mode boundary detection to allow fast re-centering within the cavity mode.

36. The apparatus of claim 21, further comprising means for switching the front and back mirror currents discontinuously when a cavity mode boundary is detected.

37. The apparatus of claim 21, further comprising means for:
   (1) setting the front and back mirror currents to an estimate of the target channel's mirror currents,
   (2) measuring the wavelength of the output beam to determine a wavelength error resulting from the setting step; and
   (3) converting the wavelength error to corrections for the front and back mirror currents.

38. The apparatus of claim 21, further comprising means for:
   (1) setting an initial estimated front mirror current $Ifm_{est}$, estimated front mirror current $Ibm_{est}$, and phase section currents $Iph_{est}$ for the wavelength of the target channel;
   (2) generating a time zero calibrated front mirror current $Ifm_0$ and a time zero calibrated front mirror current $Ibm_0$ from the feedback signal;
   (3) determining a wavelength error from the feedback signal and terminating the method when the wavelength error is less than a specified amount;
   (4) computing error vectors for the front and back mirror currents:

$\Delta Ifm = Ifm_{est} - Ifm_0$ $\Delta Ibm = Ibm_{est} - Ibm_0$ (5) computing first order corrections for the front and back mirror currents:

$Ifm_{est}' = Ifm_{est} + \Delta Ifm$ $Ibm_{est}' = Ibm_{est} + \Delta Ibm$ (6) setting the estimated front mirror current $Ifm_{est}$ and the estimated front mirror current $Ibm_{est}$ to the first order corrections $Ifm_{est}'$ and $Ibm_{est}'$;
   (7) repeating from step (2).

39. The apparatus of claim 38, further comprising means for dithering the front and back mirror currents in accordance with cavity mode boundary detection to re-center within the cavity mode.

40. The apparatus of claim 38, further comprising means for computing second order corrections for the front and back mirror currents based on an aging model and setting the estimated front mirror current $Ifm_{est}$ and the estimated back mirror current $Ibm_{est}$ to the second order corrections.

41. A method for switching from an initial channel to a target channel for an output beam of a laser, comprising:
   (a) ramping front and back mirror currents for the laser in a coordinated manner based on a traversal of a mode map along a path leading from the initial channel to the target channel, wherein the mode map comprises a two-dimensional plot of the front and back mirror currents that identifies one or more cavity modes for the laser;
   (b) detecting cavity mode boundaries as the front and back mirror currents for the laser are ramped; and
   (c) comparing the detected cavity mode boundaries with the cavity mode boundaries in the mode map in order to provide incremental corrections to the traversal of the mode map.

42. The method of claim 41, wherein the front and back mirror currents are ramped in the coordinated manner to induce cavity mode hops with a phase current held constant.

43. The method of claim 41, wherein the comparing step (c) comprises counting intermediate cavity mode boundaries.

44. The method of claim 41, wherein the comparing step (c) comprises comparing positions of the detected cavity mode boundaries with the positions of the cavity mode boundaries in the mode map to generate a feedback signal that corrects for aging-induced changes in the front and back mirrors' tuning efficiencies.

45. The method of claim 41, wherein the traversal of the mode map along the path leading from the initial channel to the target channel is based on intermediate motion through one or more cavity mode centers.

46. The method of claim 45, wherein the motion comprises one or more slides, side-slides or jumps.

47. The method of claim 46, wherein the slide comprises continuous movement along a positive diagonal supermode trajectory in the mode map.

48. The method of claim 46, wherein the side-slide comprises continuous movement transverse to a supermode trajectory in the mode map.

49. The method of claim 46, wherein the jump comprises discontinuous movement from a center of one cavity mode to a center of another cavity mode in the mode map.

50. The method of claim 45, wherein the motion generates one or more errors in one or more dimensions as a result of device aging.

51. The method of claim 50, further comprising applying one or more motion rules to the traversal of the mode map, wherein each of the motion rules is a constraint on a maximum distance that is traveled in one direction in the mode map before movement in an orthogonal direction is required.

52. The method of claim 41, further comprising moving the front and back mirrors by fractional cavity mode spacing to obtain the target channel.

53. The method of claim 41, further comprising using cavity mode boundary detection to allow fast re-centering within the cavity mode.

54. The method of claim 41, further comprising switching the front and back mirror currents discontinuously to proximate to a next expected cavity mode boundary, when a cavity mode boundary is detected.

55. An apparatus for switching from an initial channel to a target channel for an output beam of a laser, comprising:
   (a) means for ramping front and back mirror currents for the laser in a coordinated manner based on a traversal of a mode map along a path leading from the initial channel to the target channel, wherein the mode map comprises a two-dimensional plot of the front and back mirror currents that identifies one or more cavity modes for the laser;

(b) means for detecting cavity mode boundaries as the front and back mirror currents for the laser are ramped; and (c) means for comparing the detected cavity mode boundaries with the cavity mode boundaries in the mode map in order to provide incremental corrections to the traversal of the mode map.

56. The apparatus of claim 55, wherein the front and back mirror currents are ramped in the coordinated manner to induce cavity mode hops with a phase current held constant.

57. The apparatus of claim 55, wherein the means for comparing (c) further comprises means for counting intermediate cavity mode boundaries.

58. The apparatus of claim 55, wherein the means for comparing (c) further comprises means for comparing positions of the detected cavity mode boundaries with the positions of the cavity mode boundaries in the mode map to generate a feedback signal that corrects for aging-induced changes in the front and back mirrors' tuning efficiencies.

59. The apparatus of claim 55, wherein the traversal of the mode map along the path leading from the initial channel to the target channel is based on intermediate motion through one or more cavity mode centers.

60. The apparatus of claim 59, wherein the motion comprises one or more slides, side-slides or jumps.

61. The apparatus of claim 60, wherein the slide comprises continuous movement along a positive diagonal supermode trajectory in the mode map.

62. The apparatus of claim 60, wherein the side-slide comprises continuous movement transverse to a supermode trajectory in the mode map.

63. The apparatus of claim 60, wherein the jump comprises discontinuous movement from a center of one cavity mode to a center of another cavity mode in the mode map.

64. The apparatus of claim 59, wherein the motion generates one or more errors in one or more dimensions as a result of device aging.

65. The apparatus of claim 64, further comprising means for applying one or more motion rules to the traversal of the mode map, wherein each of the motion rules is a constraint on a maximum distance that is traveled in one direction in the mode map before movement in an orthogonal direction is required.

66. The apparatus of claim 55, further comprising means for moving the front and back mirrors by fractional cavity mode spacing to obtain the target channel.

67. The apparatus of claim 55, further comprising means for using cavity mode boundary detection to allow fast re-centering within the cavity mode.

68. The apparatus of claim 55, further comprising means for switching the front and back mirror currents discontinuously to proximate to a next expected cavity mode boundary, when a cavity mode boundary is detected.

69. A method for switching from an initial channel to a target channel for an output beam of a laser, comprising:

(a) setting front and back mirror currents for the laser to an estimate of the front and back mirror currents for the target channel obtained from a mode map, wherein the mode map comprises a two-dimensional plot of the front and back mirror currents that identifies one or more cavity modes for the laser;

(b) measuring a wavelength of the output beam to determine a wavelength error resulting from the setting step; and (c) converting the wavelength error to corrections for the front and back mirror currents.

70. The method of claim 69, further comprising computing error vectors for the front and back mirror currents and computing the corrections for the front and back mirror currents based on the error vectors.

71. The method of claim 69, further comprising dithering the front and back mirror currents in accordance with cavity mode boundary detection to re-center within the cavity mode.

72. The method of claim 69, wherein the corrections are first order corrections for the front and back mirror currents.

73. The method of claim 72, wherein the corrections are second order corrections for the front and back mirror currents based on an aging model.

74. An apparatus for switching from an initial channel to a target channel for an output beam of a laser, comprising:

(a) means for setting front and back mirror currents for the laser to an estimate of the front and back mirror currents for the target channel obtained from a mode map, wherein the mode map comprises a two-dimensional plot of the front and back mirror currents that identifies one or more cavity modes for the laser;

(b) means for measuring a wavelength of the output beam to determine a wavelength error resulting from the setting step; and (c) means for converting the wavelength error to corrections for the front and back mirror currents.

75. The apparatus of claim 74, further comprising means for computing error vectors for the front and back mirror currents and for computing the corrections for the front and back mirror currents based on the error vectors.

76. The apparatus of claim 74, further comprising means for dithering the front and back mirror currents in accordance with cavity mode boundary detection to re-center within the cavity mode.

77. The apparatus of claim 74, wherein the corrections are first order corrections for the front and back mirror currents.

78. The apparatus of claim 77, wherein the corrections are second order corrections for the front and back mirror currents based on an aging model.

* * * * *